(12) United States Patent
Lin et al.

(10) Patent No.: US 6,798,135 B2
(45) Date of Patent: Sep. 28, 2004

(54) LONG-LIFE TYPE ORGANIC ELECTROLUMINESCENT DEVICE

(75) Inventors: Gwo-Sen Lin, Taichung (TW); Wen-Chun Wang, Taichung (TW)

(73) Assignee: Windell Corporation, Taichung (TW)

(*) Notice: Subject to any disclaimer, the term of this patent is extended or adjusted under 35 U.S.C. 154(b) by 0 days.

(21) Appl. No.: 10/308,414

(22) Filed: Dec. 2, 2002

(65) Prior Publication Data

US 2004/0104670 A1 Jun. 3, 2004

(51) Int. Cl.$^7$ .............................................. H05B 33/00
(52) U.S. Cl. ................................... 313/506; 313/504
(58) Field of Search .......................... 313/503–509; 428/690

(56) References Cited

U.S. PATENT DOCUMENTS 6,130,001 A * 10/2000 Shi et al. .................... 313/504

\* cited by examiner

*Primary Examiner*—Joseph Williams
(74) *Attorney, Agent, or Firm*—Birch, Stewart, Kolasch & Birch, LLP

(57) ABSTRACT

An organic electroluminescent device includes an emitting layer comprising AxByCz inserted between the anode and the cathode. The emitting layer with different materials is a continuously mixed single layer in the organic electroluminescent device without heterojunctions. Moreover, a transporting auxiliary comprising LiF alone or a mixture comprising the hole transporting material, the electron transporting material AxBy and a % wt is inserted between the emitting layer and the cathode electrode.

11 Claims, 1 Drawing Sheet

LONG-LIFE TYPE ORGANIC ELECTROLUMINESCENT DEVICE

FIELD OF THE INVENTION

The present invention pertains to an organic electroluminescent devices and more specifically to a structure for improving the efficiency and lifetime of an organic electroluminesocnt device.

BACKGROUND OF THE INVENTION

In recent progress of the organic electroluminescent device, the organic EL devices are attractive owing to the merits of high brightness, wide viewing angle, low driving voltage and capability for full color flat portable emissive displays. The normal organic electroluminescent device composes multi-layers of thin film sandwiched between two electrodes. The organic layer composes hole transporting layer, light emission layer and electron transporting layer. Either the electron transporting layer or the hole transporting layer can be designed as the emissive layer and the light can be transmitted either way but generally exits through one of the conductive layers. There arm many methods to modify one of the conductive layers for the emission of light there through but it has been observed that the most efficient organic electroluminescent device includes one conductive layer, which is transparent to the light being emitted. The widely used material for this conductive and transparent layer is indium-tin-oxide (ITO), which is usually deposited on a transparent substrate, for example, the glass or plastic plate.

Although the multi-layer structure is normally used in constructing the organic electroluminescent devices, the interface between the electron transporting layer and the hole transporting layer is not compatible and results in a bad junction in the interface of the different layers and eventually causes the stripped off phenomenon in the device under high temperature condition. Also the lifetime of multi-layered organic electroluminescent devices is influenced by the abrupt change of the interface between the hole and electron transporting layers when the organic EL device is under voltage bias.

Significant efficiency change of the electroluminescent has been achieved in the prior art (See U.S. Pat. No. 5,925,980). In this the patent, a structure of electroluminescent is provided which comprises a hole transporting region, an electron transporting region and a graduated region disseminated between the hole transporting region and the electron transporting region is provided. The graduated region changes, either in steps or continuously, from the hole transporting organic material adjacent to the hole transporting region to the electron transporting organic material adjacent to the electron transporting region. Further improvement is still needed for applications where lifetime is a primary concern.

The lifetime of an organic electroluminescent is affected by the stability of both the bulk morphology of the hole transporting materials and the interface between the hole and electron transporting layers when the organic electroluminescent is applied bias.

Several schemes have been proposed to address the problem of bulk morphology stability of the hole transporting material in an organic electroluminescent. Among other things, the lifetime of the electroluminescent device is improved by the elimination of heterojunction in a continuous organic medium (See U. S. Pat No. 6,130,001). In the patent, it provides an organic electroluminescent layer which comprises a continuous organic medium $A_xB_y$, where A and B an components capable of transporting holes and electrons, respectively and x represents the content of A component with a value ranging form 0 adjacent to the anode to 100% adjacent to the cathode, and y represents the content of B component with a value ranging from 0 adjacent to the cathode to 100% adjacent to the anode. The lifetime of the device is thus improved by the elimination of heterojunctions in the continuous organic medium.

Generally, there is always a need to provide a smooth reliable region so that the interface effect can be reduced to a minimum. However, the smooth reliable region should not come at the expense of the lifetime and efficiency of the organic electroluminescent device. Also, the elimination of the barrier in the interface between different layers will give the electroluminescent device with great improvement in reliability and life time.

It is a purpose of the present invention to provide a new and simplified organic electroluminescent device with an improved lifetime.

It is another purpose of the present invention to provide a new and simplified organic electroluminescent device with high efficiency.

It is still another purpose of the present invention to provide a new and simplified organic electroluminescent device with improved stability.

SUMMARY OF THE INVENTION

The above problems and others are at least partially solved and the above purposes and others are realized in an organic electroluminescent device including an emitting layer comprising $A_xB_yC_z$ inserted between the anode and the cathode, and a transporting auxiliary layer is inserted between the emitting layer and the cathode. The emitting layer with different materials are mixed in a single layer which can solve the normally observed interface problem. Moreover, the transporting auxiliary layer comprises LiF (electron injecting material) alone or a mixture of the hole transporting material and the electron transporting material $A_xB_y$ and an a % wt of LiF. The purpose of the transporting auxiliary layer is used mainly to enhance the transporting performance efficiency of both electron and hole in the electroluminescent device.

The emitting layer $A_xB_yC_z$ comprises a conventional hole transporting material $A_x$, a new electron transporting material $B_y$, and at least a new non-dopant emitting material or pigment $C_z$ incorporated in the organic emitting layer and x, y, z denotes the content of the medium A, B, C respectively. While the transporting auxiliary layer comprises LiF alone or $A_xB_y$ and an a % wt of LiF mixture. The three materials used for forming the electroluminescent device (A, B, and LiF) are mixed evaporated according to a specific combination ratio in the chamber to form the new structure of the emitting device.

Furthermore, the content x, y, and z in medium A, B, and C in both of the emitting layer and the transporting auxiliary layer have the following characteristics: the content x of medium A is gradually reduced from 100% adjacent to the anode to 0% adjacent to the cathode, the content y of medium B is gradually increased from 0% adjacent to the anode to 100% adjacent to the cathode, while the content z of the non-dopant emission material C is gradually increased from 0% adjacent to the anode to 100% adjacent to the transporting auxiliary layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE INVENTION

Figure 1:
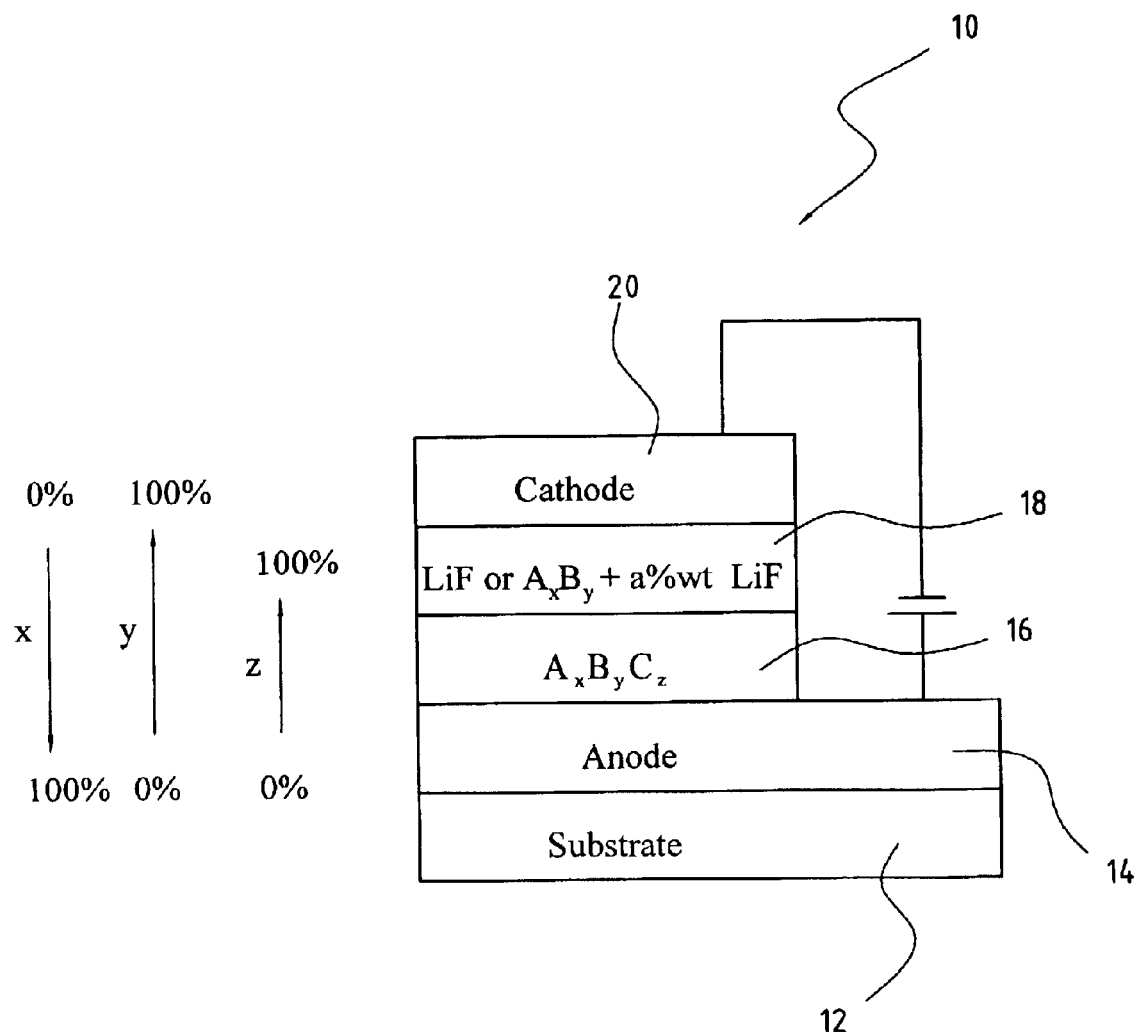
FIG. 1 depicts a simplified sectional view of an organic electroluminescent (EL) in this invention.

Referring now to FIG. 1, a simplified sectional view of an organic electroluminescent (EL) device 10 in accordance with the present invention is illustrated. Device 10 is fabricated upon a substrate 12 in which it is transparent in this preferred embodiment, and may be fabricated of any of a number of known materials employed in the art. For example, the substrate 12 may be fabricated of a glass, such as Corning 7059 glass, transparent plastic substrate made of polyolefins, polyethersulfones, polyarylates, etc.

Deposited atop substrate 12 is an anode 14, which is conductive and optically transparent or semi-transparent. The material used for the anode 14 includes conductive metal oxides such as indium oxide, indium-tin oxide (ITO), indium-zinc oxide IZO), zinc-tin oxide, conductive transparent polymers such as polyaniline. The anode 14 can also be made of a semi-transparent metal, which includes a thin layer (<500 angstroms) of gold, copper, silver, and combinations thereof.

Thereafter, atop the anode 14 is the emitting layer 16 and furthermore a transporting auxiliary layer 18 is also inserted between the emitting layer 16 and the cathode 20. In this embodiment, the emitting layer 16 is composed of a mixed continuous organic medium without heterojunctions. The continuous organic medium has a general formula of $A_xB_yC_z$, wherein A denotes the medium comprising the hole transporting material, B denotes the medium comprising electron transporting material, and C denotes the medium comprising non-dopant light emission material and x, y, and z denote the content of the components A, B, and C respectively. It is to be noted that the transporting auxiliary layer 18 comprises LiF alone or a mixture of hole transporting material and electron transporting material $A_xB_y$ and a % wt of LiF, a it is obviously seen from FIG. 1 that the medium C is not in the transporting auxiliary layer 18. While the relationship between x and y is: x=100%=y, the variations of x and y will generally be substantially linear. It a should be understood by those skilled in the art that variations other than linear may also be incorporated. The rate of the decrease of A (hole transporting material) component and the increase of the B (electron transporting material) component can be easily controlled by evaporation or sputtering rates. While the content of a % wt of LiF in the transporting auxiliary layer 18 is kept 0% wt adjacent to the emitting layer 16 to 5% wt adjacent to the cathode 20.

The materials for forming the organic electroluminescent structure are conducted by mixed evaporation technique through the valve release of the different gases.

The material used for fabrication of the cathode is typically formed of a metal with a work function of less than 4 eV and at least one other protective metal of higher work function. The material for the low work function is selected from a group of lithium, cesium, calcium, or strontium while the preferred high work function metal is selected from a group of aliuminum, indium, copper, gold, or silver. Alternatively, the cathode can be made of an alloy of a lower work function metal and a higher work function metal by co-evaporation technique.

While the preferred embodiment includes a transparent substrate and anode, it will be understood by those skilled in the art that the entire structure could be reversed so that the light is emitted upwardly in FIG. 1 and the substrate could then be opaque material.

It should be pointed out that the emission non-dopant material is either fluorence or phosphorence. In this embodiment, generally, the hole transporting and electron transporting materials arc deposited on the anode by any of the well known evaporation or sputtering techniques. In a typical example, the substrate 12 is positioned in an evaporation chamber (not shown). A source of electron transporting organic material, a source of hole transporting organic material, a source of non-dopant material and LiF material are positioned sequentially in the evaporation chamber. In this preferred embodiment, the four sources (designated as A, B. C, and LiF) ax kept in separate containers, which can be gradually and continuously opened or closed.

The process starts by simultaneously opening the four containers for the release of the electron transporting material, the hole transporting material and the non-dopant material and the density of components A, B, and C arc carefully controlled on each valve to determine the released amount of each material. When the emitting 16 layer 16 is constructed, the valve of the non-dopant material C is stopped. The deposition of the transporting auxiliary layer 18 is then started by providing the LiF gas alone or a mixture of $A_xB_y$ and a % wt of LiF gases. At this moment, the density decreasing trend of the content x of component A and the density increasing trend of the content B are still going on and throughout the transporting auxiliary layer 18. Furthermore, the a % wt density of LiF is kept 0% adjacent 12 the emitting layer 16 to 5% adjacent to the cathode 20.

Because of the gradual content change of each component from the cathode side 20 to the anode side 14, the interface problem can be largely reduced and the emitting efficiency can also be greatly enhanced.

Accordingly, a new and improved method has been disclosed for fabricating a new organic semiconductor layer. While evaporation coating is presently the primary method for depositing these materials, it will be understood by those skilled in the art that the present method applies to any other techniques (e.g. sputtering) in which they might be utilized or devised.

While we have shown and described specific embodiments of the present invention, further modifications and improvements will occur to those skilled in the art. We are understood, therefore, that this invention is not limited to the particular forms shown and we intend in the appended claims to cover all modifications that do not depart from the spirit and scope of this invention.

What is claimed is:

1. An organic electroluminescent device comprising:
    an anode electrode and a cathode electrode;
    an emitting layer positioned between said anode electrode and said cathode electrode, said emitting layer being an organic complex comprising a hole transporting material, an electron transmitting material and a non-dopant light emission material combined as a mixed continuous single layer organic electroluminescent region on the top of said anode electrode; and
    a transporting auxiliary layer positioned between said emitting layer and said cathode electrode;
    wherein the content of said non-dopant light emission material is increased from 0% adjacent to said anode electrode to 100% adjacent to said transporting auxiliary layer.

2. The organic electroluminescent device as claimed 1, wherein the content of said hole transporting material is gradually reduced from 100% adjacent to said anode electrode to 0% adjacent to said cathode electrode.

3. The organic electroluminescent device as claimed in claim 1, wherein the content of said electron transporting material is increased from 0% adjacent to said anode electrode to 100% adjacent to said cathode electrode.

4. The organic electroluminescent device as claimed in claim 1, wherein said transporting auxiliary layer comprises LiF and the content of said LiF is increased from 0% adjacent to said emitting layer to 5% adjacent to said cathode electrode.

5. The organic electroluminescent device as claimed in claim 1, wherein said cathode electrode is made of a metal with a low work function of less than 4 eV and at least one other protective metal of higher work function.

6. The organic electroluminescent device as claimed in claim 5, wherein said metal with low work function is selected from a group of lithium, cesium, calcium, or strontium.

7. The organic electroluminescent device as claimed in claim 5, wherein said protective metal for higher work function is selected from a group of aluminum, indium, copper, gold, or silver.

8. The organic electroluminescent device as claimed in claim 1, wherein said non-dopant light emission material is fluorence or phosphorence.

9. The organic electroluminescent device as claimed in claim 1, wherein said electron transporting material is alkalin metal.

10. The organic electroluminescent device as claimed in claim 1, wherein said hole transporting, said electron transporting, and said non-dopant materials are deposited on a surface by evaporation or sputtering techniques.

11. The organic electroluminescent device as claimed in claim 10, wherein said evaporation or sputtering techniques are conducted by providing the sources of said electron transporting organic material, said hole transporting organic material and said non-dopant material positioned sequentially in an evaporation chamber.

* * * * *